(12) United States Patent
Kim et al.

(10) Patent No.: US 9,741,844 B2
(45) Date of Patent: Aug. 22, 2017

(54) LATERAL DOUBLE-DIFFUSED MOS TRANSISTOR HAVING DEEPER DRAIN REGION THAN SOURCE REGION

(71) Applicant: MagnaChip Semiconductor, Ltd., Cheongju-si (KR)

(72) Inventors: Young Bae Kim, Cheongju-si (KR); Jin Woo Moon, Cheongju-si (KR); Francois Hebert, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/136,739

(22) Filed: Dec. 20, 2013

(65) Prior Publication Data

US 2014/0306285 A1 Oct. 16, 2014

(30) Foreign Application Priority Data

Apr. 16, 2013 (KR) .................. 10-2013-0041869

(51) Int. Cl.

| H01L 29/78 | (2006.01) |
|---|---|
| H01L 29/06 | (2006.01) |
| H01L 29/08 | (2006.01) |
| H01L 29/10 | (2006.01) |
| H01L 29/40 | (2006.01) |
| H01L 29/423 | (2006.01) |

(52) U.S. Cl.
CPC ...... *H01L 29/7816* (2013.01); *H01L 29/0634* (2013.01); *H01L 29/0847* (2013.01); *H01L 29/0878* (2013.01); *H01L 29/7835* (2013.01); *H01L 29/1045* (2013.01); *H01L 29/1095* (2013.01); *H01L 29/402* (2013.01); *H01L 29/42368* (2013.01)

(58) Field of Classification Search
CPC ......... H01L 29/7816–29/7826; H01L 29/7835
See application file for complete search history.

(56) References Cited

U.S. PATENT DOCUMENTS

| 6,168,983 | B1 * | 1/2001 | Rumennik et al. ........... 438/188 |
|---|---|---|---|
| 2006/0284276 | A1 * | 12/2006 | Yilmaz ............... H01L 29/0634 257/492 |
| 2007/0296046 | A1 * | 12/2007 | Ohdaira et al. ............... 257/401 |
| 2008/0237703 | A1 * | 10/2008 | Lin et al. ....................... 257/336 |
| 2008/0258215 | A1 * | 10/2008 | Tornblad et al. ............. 257/343 |
| 2008/0261358 | A1 * | 10/2008 | Sonsky ......................... 438/197 |
| 2010/0123194 | A1 * | 5/2010 | Miyagawa et al. ........... 257/335 |
| 2010/0244152 | A1 * | 9/2010 | Bahl et al. .................... 257/408 |
| 2014/0203358 | A1 * | 7/2014 | Yang .................. H01L 29/7835 257/335 |

\* cited by examiner

*Primary Examiner* — Kevin Parendo
(74) *Attorney, Agent, or Firm* — NSIP Law

(57) ABSTRACT

Provided is a semiconductor power device. The semiconductor power device includes a well disposed in a substrate, a gate overlapping the well, a source region disposed at one side of the gate, a buried layer disposed in the well, and a drain region or a drift region contacting the buried layer.

19 Claims, 23 Drawing Sheets

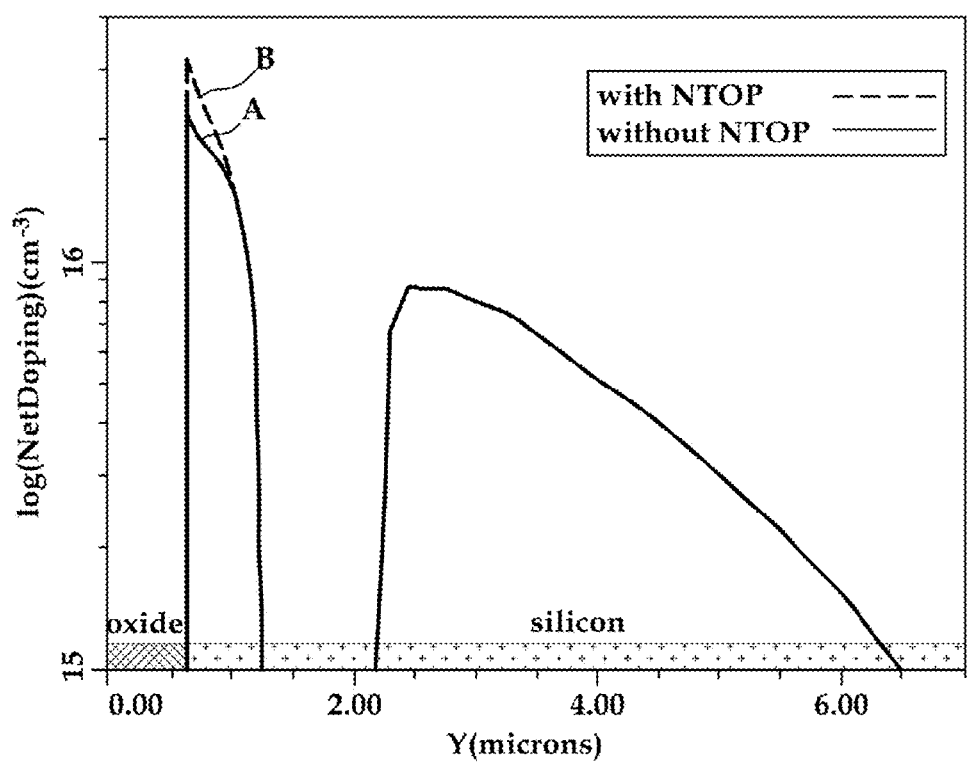

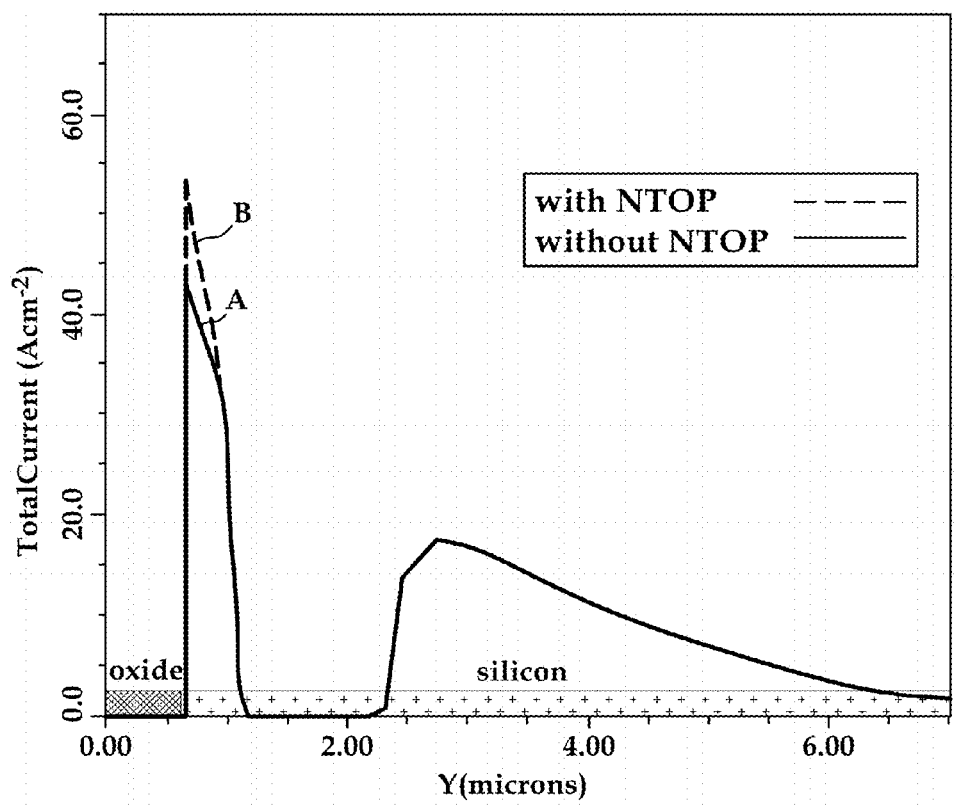

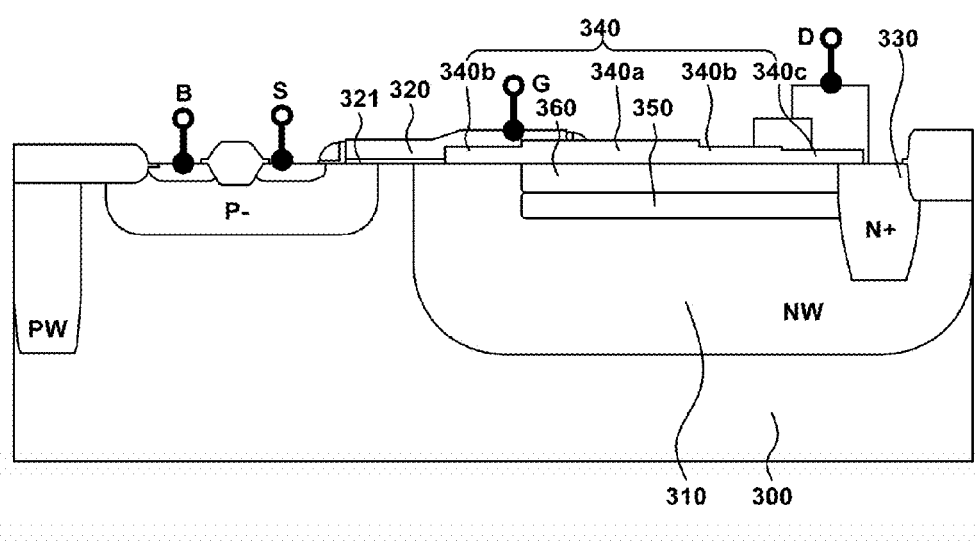

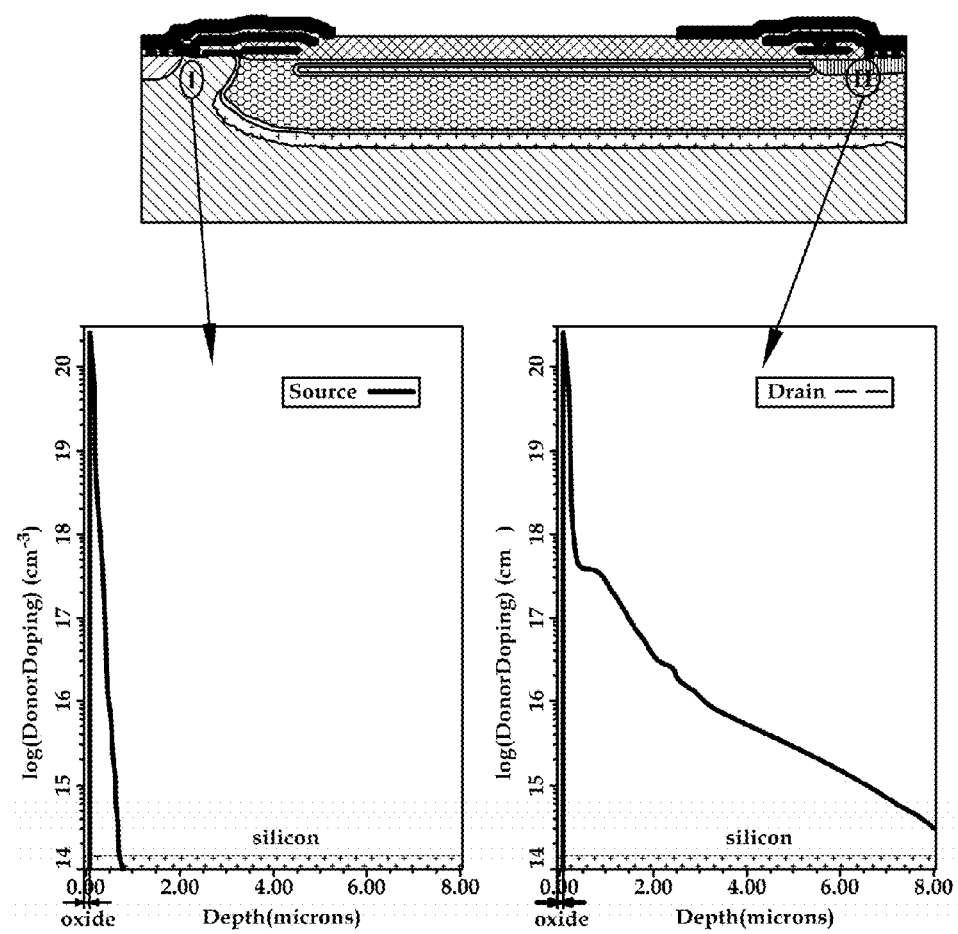

LATERAL DOUBLE-DIFFUSED MOS TRANSISTOR HAVING DEEPER DRAIN REGION THAN SOURCE REGION

CROSS-REFERENCE TO RELATED APPLICATION

This application claims the benefit under 35 USC 119(a) of Korean Patent Application No. 10-2013-0041869 filed on Apr. 16, 2013, in the Korean Intellectual Property Office, the entire disclosure of which is incorporated herein by reference for all purpose.

BACKGROUND

1. Field

The following description relates to a power device and to, for example, a lateral double-diffused metal oxide semiconductor (LDMOS) with an expanded drain region that exhibits a high breakdown voltage and a fast switching response.

2. Description of Related Art

MOSFET devices have been widely used in power conversion and regulation circuits due to their high-switching frequency and low power loss. There are various types of power MOSFET devices known as double-diffused MOS transistors. For example, a vertical version of double-diffused MOS transistor is known as a vertical double-diffused metal oxide semiconductor (VDMOS). A lateral version of double-diffused MOS transistor is known as a lateral double-diffused metal oxide semiconductor (LDMOS).

When a silicon-on-insulator (SOI) substrate is used to fabricate a power integrated circuit (IC), the fabrication process may be simplified in comparison to using a bulk silicon substrate. However, the SOI substrate is too expensive for most applications. Further, VDMOS transistors have large power handling capabilities; however, VDMOS transistors are more difficult to implement in an IC technology in comparison to LDMOS transistors.

LDMOS devices are widely used as a switch for control, logic, and power. LDMOS devices have to exhibit a high breakdown voltage (BV) to endure a high applied voltage as well as low specific on-resistance Rsp to minimize conduction losses. Rsp is defined as the resistance of the device times its active area.

However, current LDMOS devices have a structure incapable of providing the high breakdown voltage and low specific on-resistance, and this limits improvements that may be made to the switching characteristics of the LDMOS devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various examples described below relate to a semiconductor power device with a high breakdown voltage and fast switching characteristics obtained through improvements in the structure thereof, while the present disclosure is not limited thereto.

In one general aspect, there is provided a semiconductor power device, including a well disposed in a substrate, a gate overlapping the well, a source region disposed at one side of the gate, a buried layer disposed in the well, and a drain region contacting the buried layer and having a different depth from the source region.

A depth of the drain region may be equal to or larger than a depth of the buried layer, and an end of the buried layer contacts the drain region.

A doping concentration of the drain region may be different from a doping concentration of the source region.

A depth of the drain region may be larger than a depth of the source region.

The drain region may include a first section and a second section, the first section having a different doping concentration from the second section.

The first section may have a depth in a range of 0.5 to 1 micron from a surface of the substrate, and may have a peak concentration in a range of $10^{18}$ to $10^{21}$ ions/cm$^3$.

The second section may have a depth in a range of 1 to 10 microns from a surface of the substrate, and may have a peak concentration in a range of $10^{14}$ to $10^{18}$ ions/cm$^3$.

The general aspect of the semiconductor power device may further include an insulating layer disposed between the gate and the drain region.

The general aspect of the semiconductor power device may further include a doping layer disposed on the buried layer.

The doping layer may be a region having a doping concentration higher than a doping concentration of the well.

The doping layer may have a doping concentration lower than a doping concentration of the first section.

One end of the doping layer may contact the drain region.

At least one pair of the buried layer and the doping layer may be disposed in the well, and the buried layer and the doping layer may be alternately disposed.

Only portions of a plurality of buried layers and a plurality of doping layers may contact the drain region.

The insulating layer may include one selected from the group consisting of a local oxidation of silicon (LOCOS) oxide layer, a plate-like insulating layer, and a shallow trench isolation (STI) layer.

The insulating layer may be formed by combining a LOCOS oxide layer and an STI layer.

The insulating layer may be a plate-like insulating layer including a LOCOS oxide layer.

The insulating layer may be formed by combining a LOCOS oxide layer, a plate-like insulating layer, and an STI layer.

The general aspect of the semiconductor power device may further include an epitaxial layer disposed on the substrate, and an isolation region for electrical insulation from an adjacent device, the isolation region contacting a body region disposed in the epitaxial layer.

The well and the doping layer may be a first conductivity type region, and the buried layer may be a second conductivity type region.

In another general aspect, there is provided a semiconductor power device, including a substrate, a well disposed in the substrate, a drain region disposed in the well, a drift region having a doping concentration lower than a doping concentration of the drain region, and a buried layer disposed in the well and contacting one end of the drift region.

The general aspect of the semiconductor power device may further include a doping layer disposed on the buried layer.

The doping concentration of the doping layer may be higher than a doping concentration of the well.

Other features and aspects will be apparent from the following detailed description, the drawings, and the claims.

BRIEF DESCRIPTION OF THE DRAWINGS

FIG. 8A is a graph illustrating a doping concentration of a cross-section I-I' of the power device illustrated in FIG. 6.

FIG. 8D is a graph illustrating a current flow state of a cross-section I-I' of the power device illustrated in FIG. 6.

FIGS. 14A and 14B are cross-sectional views illustrating power devices according to additional examples.

FIG. 16 is a graph illustrating doping concentrations of a source and a drain of a power device according to another example.

Figure 1:
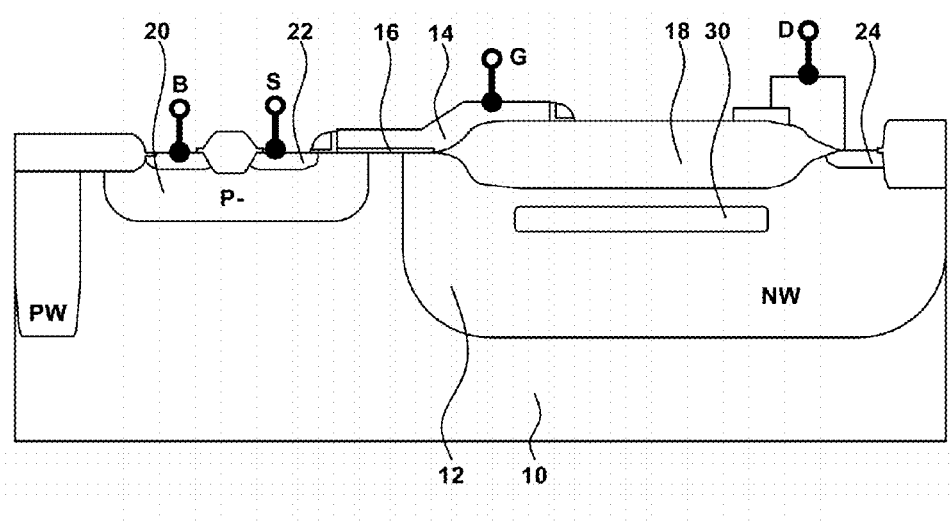
FIG. 1 is a cross-sectional view of an example of a power device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

Expressions such as "first conductivity type" and "second conductivity type" as used herein may refer to the conductivity types such as N or P types which are opposed to each other, and an example explained and exemplified herein encompasses complementary examples thereof.

Also, illustrative examples may be described with reference to schematic cross-sectional views or plan views, which are schematic diagrams of idealized examples. As such, variations from the shapes of the illustrations, as a result, for example, of manufacturing techniques and/or tolerances, are to be expected. For example, an etched region illustrated in a right angle may be in a rounded shape or in a shape of having a predetermined curvature. Thus, illustrative examples should not be construed as being limited to the particular shapes of regions illustrated herein, but are to include deviations in shapes that result from, e.g., a manufacturing process. Thus, the regions illustrated in the drawings are schematic in nature and are not intended to limit the scope of the claims.

Like reference numerals designate like elements throughout the specification. Therefore, even though identical or similar reference numerals are not described in the corresponding drawing, they may be described with reference to the other drawings. Also, even though no reference numeral is indicated, it may be described with reference to the other drawings.

In various examples described below, an $N^+$ type region of a drain terminal formed in a semiconductor power device is expanded to reduce a resistance component due to a dopant, in order to improve a breakdown voltage, and to ensure fast switching characteristics. However, the present disclosure is not limited thereto.

To obtain a high breakdown voltage and low on-resistance at the same time, a reduced surface field (RESURF) structure that reduces the peak electric field in the drain region of MOSFETs has been developed. Hereinafter, semiconductor power devices capable of providing the above-described technical features according to various examples are described with reference to the accompanying drawings.

Figure 2:
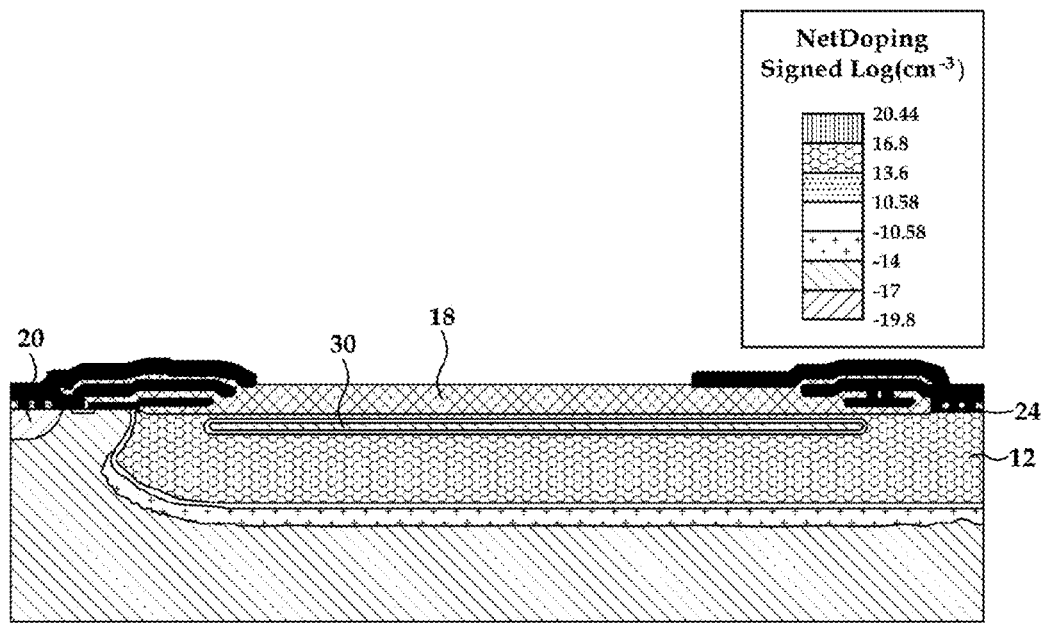
FIG. 2 is a cross-sectional view illustrating a doping concentration simulation of the power device illustrated in FIG. 1.

FIG. 1 is a cross-sectional view of an example of a power device. FIG. 2 is a view illustrating a doping concentration simulation of the power device illustrated in FIG. 1. The power device illustrated in FIG. 1 may be implemented as an LDMOS device.

Referring to FIG. 1, an N type well 12 is formed in a predetermined region of a P type substrate 10. An insulating layer is formed on the N type well 12, and a gate 14 overlapping the N type well 12 is formed on the insulating layer. The insulating layer includes a thin gate oxide layer 16 and a LOCOS oxide layer 18.

A P type body region 20 is formed at one side of the gate 14, and an $N^+$ type source contact region 22 is included in the P type body region 20.

An $N^+$ type region 24 of a drain terminal insulated from the gate 14 by the LOCOS oxide layer 18 is formed in the N type well 12.

Further, a gate electrode G is connected to the gate 14, and a source electrode S is connected to the source contact region 22. A drain electrode D is connected to the $N^+$ type region 24. In FIG. 1, the reference numeral B denotes a body electrode.

To provide a high breakdown voltage to the LDMOS device having the above-described structure, a P type buried layer (hereinafter, referred to as a $P^-$ type buried layer) 30 is formed in the N type well 12 without higher energy than the N type well 12. Referring to FIG. 1, the $P^-$ type buried layer 30 is formed so as to extend in a lateral direction of the P type substrate 10, and is spaced apart from the LOCOS oxide layer 18 in a vertical direction of the P type substrate. The $P^-$ type buried layer 30 may be formed such that a length of the $P^-$ type buried layer 30 is larger than or smaller than a length of the LOCOS oxide layer 18, or the length of the $P^-$ type buried layer 30 is the same as a length of the LOCOS oxide layer 18.

Thus, a path for current flow between the source S and the drain D may be formed between the LOCOS oxide layer 18 and the $P^-$ type buried layer 30, and the LDMOS device may have a breakdown voltage of a certain level or more.

In this example, the $P^-$ type buried layer 30 and the $N^+$ type region 24 are spaced apart from each other. It can be easily seen from the doping concentration simulation of FIG. 2 that the $P^-$ type buried layer 30 and the $N^+$ type region 24 are spaced apart from each other. Referring to FIG. 2, the $N^+$ type region 24 is formed only along a surface of the P type substrate 10.

However, as the LDMOS device of FIG. 1 has a structure in which the $P^-$ type buried layer 30 and the $N^+$ type region 24 are spaced apart from each other, current flowing between the source S and the drain D passes through the N type well 12, which is a high resistance region because the N type well 12 has a low doping concentration.

Therefore, in the example described above, the current flow path between the source S and the drain D is formed to improve a breakdown voltage, but the current flow from the source S to the drain D is interrupted by the high resistance region.

The structure of an LDMOS device may be modified to improve the current flow.

Various examples of LDMOS devices are described below. In the examples described below, detailed description of portions of power devices that have the same structures as the example of the power device illustrated in of FIG. 1 is omitted.

Figure 3:
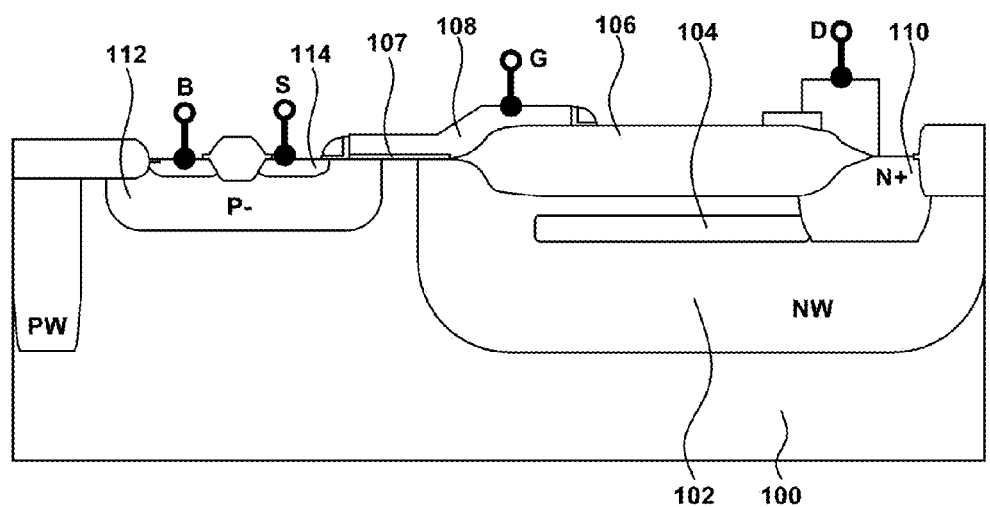
FIG. 3 is a cross-sectional view illustrating another example of a power device.
Figure 4:
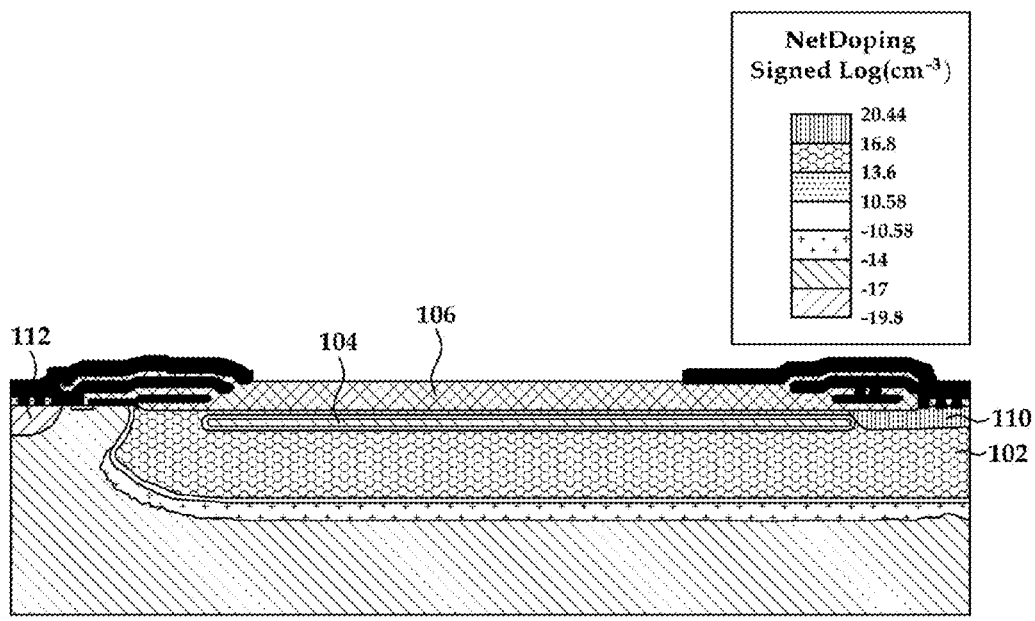
FIG. 4 is a cross-sectional view illustrating a doping concentration simulation of the power device of FIG. 3.
Figure 5:
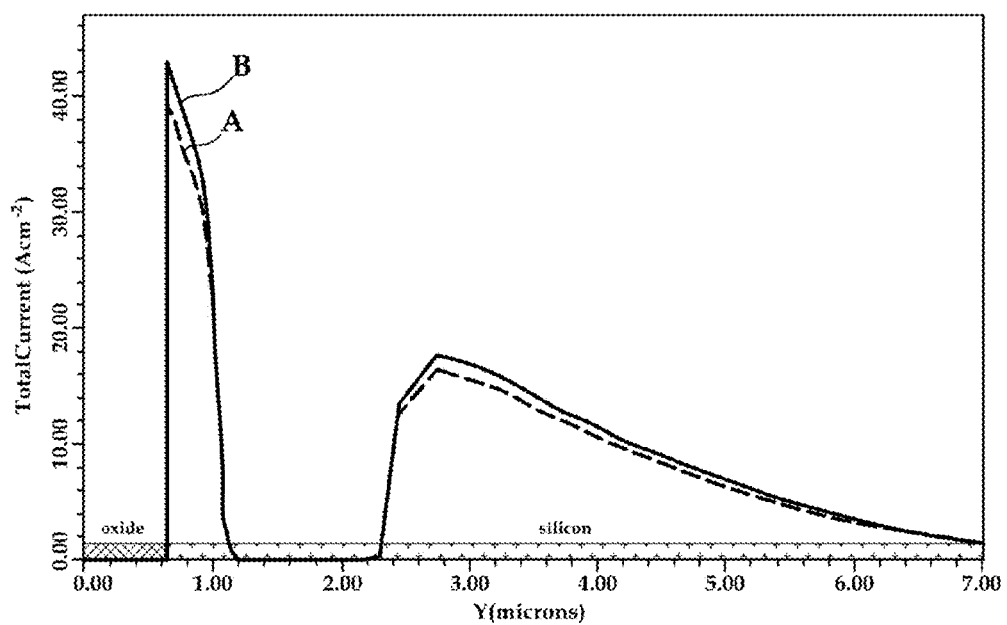
FIG. 5 is a graph comparing current flow states in the power devices illustrated in FIGS. 1 and 3.

FIG. 3 is a cross-sectional view illustrating a first example of a power device. FIG. 4 is a view that illustrates the result of a doping concentration simulation of the power device illustrated in FIG. 3. FIG. 5 is a graph compares current flow states of the power devices illustrated in FIGS. 1 and 3.

In the first example illustrated in FIG. 3, an $N^+$ type region is expanded, in comparison to the example illustrated in FIG. 1.

Referring to FIG. 3, an N type well 102 is formed in a predetermined region of a P type substrate 100.

A gate 108 is formed on the N type well 102. The gate 108 is insulated by an insulating layer. A portion of the gate 108 overlaps the N type well 102. The insulating layer includes a thin gate oxide layer 107 and a LOCOS oxide layer 106.

A P type body region 112 is formed at one side of the gate 108, and a source contact region 114 is formed in the P type body region 112.

A $P^-$ type buried layer 104 is formed in the N type well 102. The $P^-$ type buried layer 104 is formed to a lateral direction of the P type substrate 100 so as to be spaced apart from the LOCOS oxide layer 106 by a predetermined distance.

A high concentration $N^+$ type region 110 is configured to be insulated from the gate 108 by the LOCOS oxide layer 106. The high concentration $N^+$ type region 110 forms a drain terminal in the N type well 102. The $N^+$ type region 110 is expanded to be wider and deeper than in the $N^+$ type region 24 in the example illustrated in FIG. 1. The expanded $N^+$ type region 110 may be formed by an ion implantation process. That is, the $N^+$ type region 110 is expanded toward a bottom of the N type well 102 and simultaneously extended toward the $P^-$ type buried layer 104 so that a portion of the $N^+$ type region 110 contacts an end of the $P^-$ type buried layer 104. Since the $N^+$ type region 110 is formed through a plurality of ion implantation processes, a doping concentration in an upper portion of the $N^+$ type region 100 may be higher than that in a lower portion of the $N^+$ type region 110. The $N^+$ type region 110 may be formed using a diffusion method of forming an N well region of a monolithic integrated low voltage PMOS transistor of general IC technology. For example, the diffusion method of forming an N well region of a 5V PMOS transistor included in a 5V CMOS transistor may be used to form the $N^+$ type region 110.

Further, in an example in which a depth of the $N^+$ type region 110 is large, the $N^+$ type region 110 may be formed by forming a deep trench in the semiconductor substrate 100 and depositing a conductive polysilicon layer in the deep trench. Alternatively, the N+ type region 100 may be formed by repeatedly ion implanting impurities through ion implantation processes while increasing energy.

The contact state between the N+ type region 110 and the P− type buried layer 104 is illustrated in a doping concentration simulation of FIG. 4. In comparison to the example illustrated in FIG. 2, the N+ type region 110 of the power device illustrated in FIG. 4 extends deeper into the N type well 102 through an ion implantation process such that the N+ type region 110 contacts the P− type buried layer 104. In this example, the N+ type region 110 is formed so that a doping depth is substantially the same as a bottom of the P− type buried layer 104. In another example, the N+ type region 110 may extend deeper into the P type substrate 100 than the bottom of the P− type buried layer 104.

In a device in which the N+ type region 110 contacts the P− type buried layer 104, in a region close to the N+ type region 110, specific on-resistance Rsp on a current path located between the source S and the drain D may be reduced to in a range of 130 to 150 ohm/cm$^2$ due to an effect of the high concentration N+ type region. That is, the N type well 102 is formed to have a low concentration. Therefore, in a device in which the N+ type region 110 is expanded as described above, N type dopants between the surface of the P type substrate 100 and the P− type buried layer 104 is increased. Thus, the specific on-resistance for the device may be reduced.

FIG. 5 demonstrates that the current flow is improved in the power device illustrated in FIG. 3 as compared with the power device illustrated in FIG. 1.

In FIG. 5, curve A indicates a current flow state in a device in which the N+ type region is not expanded, as in the example illustrated in FIG. 1. Curve B indicates a current flow state in a device in which the N+ type region is expanded as in the example illustrated in FIG. 3. Curves A and B of FIG. 5 illustrate that the current flow is improved in an example in which the N+ type region is deeply expanded in comparison to an example in which the N+ type region is formed shallow along the surface of the P type substrate 10.

Figure 6:
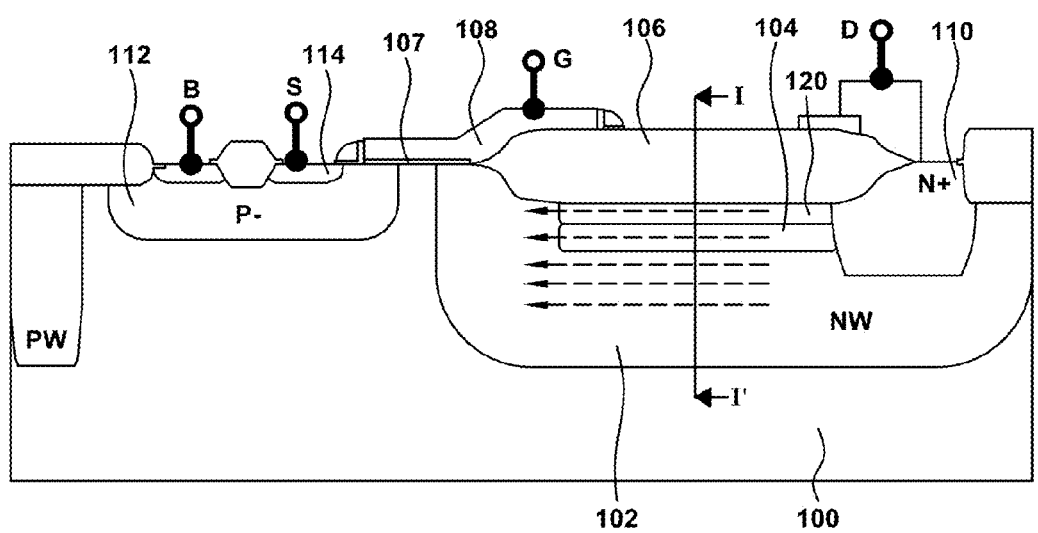
FIG. 6 is a cross-sectional view illustrating another example of a power device.
Figure 7:
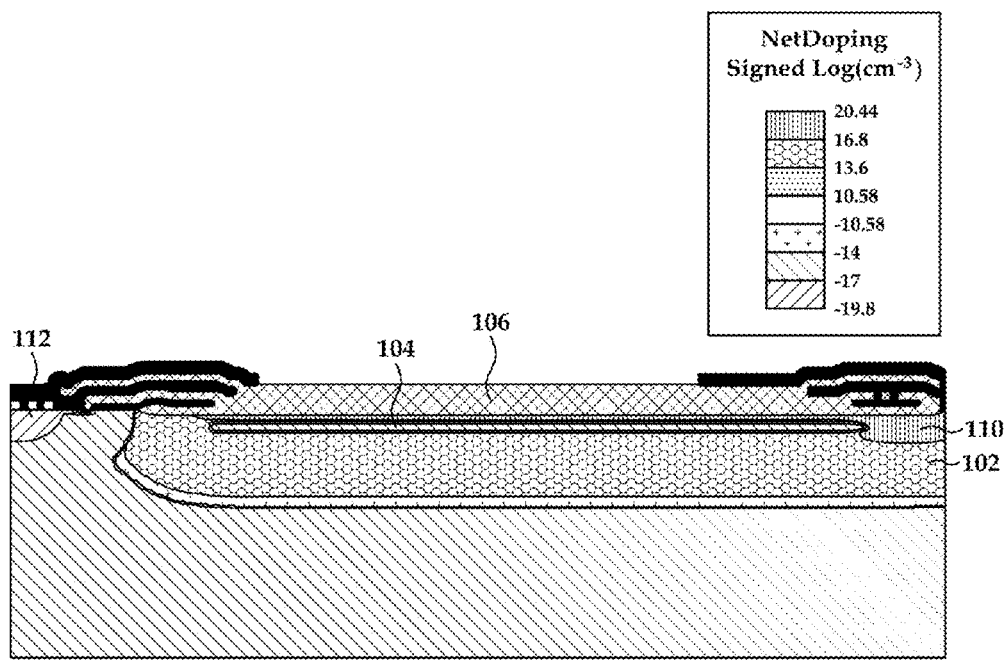
FIG. 7 is a cross-sectional view illustrating a doping concentration simulation of the power device of FIG. 6.

FIG. 6 is a cross-sectional view illustrating a power device according to a second example. FIG. 7 illustrates a doping concentration simulation of the power device illustrated in FIG. 6.

Referring to FIG. 6, a structure of the power device according to the example illustrated in FIG. 4 is the same as that of the power device illustrated in FIG. 3. However, the power device of FIG. 6 is different from the power device of FIG. 3 in that a doping layer 120 doped with N type dopants is further formed between a LOCOS oxide layer 106 and a P− type buried layer 104. The doping layer 120 is a high concentration doping region having a higher concentration than the N type well 102.

In the structure of FIG. 6, the current flows to an arrow direction.

Hereinafter, the doping layer 120 is referred to as an NTOP. The NTOP 120 is arranged such that the NTOP 120 contacts an expanded N+ type region 110.

In this example, the N+ type region 110 has a doping depth that is deeper than the doping depth of a P− type buried layer 104. However, in other examples, the N+ type region 110 may have a doping depth equal to or similar to the doping depth of the P− type buried layer 104. A doping concentration of the NTOP 120 is in a range of $10^{16}$ to $10^{17}$ ions/cm$^2$, and the NTOP 120 is doped to the P− type buried layer 104 to have a depth in a range of 0.5 to 2 μm. The N+ type region 110 has two concentration sections. In a first section, because the N+ type region 110 has a concentration in a range of $10^{18}$ to $10^{21}$ ions/cm$^2$, a doping concentration of the NTOP 120 is lower than that of the N+ type region 110.

The P− type buried layer 104 and the NTOP 120 may not have the same length. However, in an example in which the P− type buried layer 104 and the NTOP 120 have the same length, the semiconductor power device may be fabricated without an additional photo process.

A contact state of the P− type buried layer 104 and the NTOP 120 with the expanded N+ type region 110 can be seen from the doping concentration simulation of FIG. 7.

The NTOP 120 may be employed to further improve a breakdown voltage of the power device. The NTOP 120 may be formed to have substantially the same size as the P− type buried layer 104 through implantation of an N type doping material. The NTOP 120 is formed between the P− type buried layer 104 and the LOCOS oxide layer 106 to ensure a current path. A current path is ensured between the LOCOS oxide layer 106 and the P− type buried layer 104, and below the P− type buried layer by the NTOP 120.

The NTOP 120 may be simultaneously formed during the ion implantation process of forming the P− type buried layer 104 in a fabrication process of the power device. Alternatively, to minimize diffusion of dopants caused by the heat that occurs during a fabrication process, the NTOP 120 may be formed after the LOCOS process for isolating devices. That is, in an event that the NTOP 120 and the P− type buried layer 104 are formed before the LOCOS process, the P− type buried layer 104 becomes thermally diffused in a subsequent process, and the current path may be not ensured.

As described above, in a device in which the P− type buried layer 104 and the NTOP 120 are in contact with the expanded N+ type region 110, a breakdown voltage and current flow in the device are improved in comparison to a device without the expanded N+ type region 110. The improvement in the breakdown voltage and the current flow is illustrated in FIGS. 8A to 8D in which a doping concentration, a breakdown voltage, and current flow of examples having the NTOP 120 and not having the NTOP 120 are compared to each other.

Referring to FIG. 8A, the left concentration peak illustrated in FIG. 8A corresponds to a doping concentration above the P− type buried layer 104, and the right concentration peak corresponds to an N type doping concentration below the P− type buried layer 104. The N type doping concentration below the P− type buried layer 104 may indicate a doping concentration of the N type well. As illustrated in FIG. 8A, the doping concentration above the P− type buried layer 104 is in a range of $10^{16}$ to $10^{17}$ ions/cm$^2$, and the doping concentration below the P− type buried layer 104 (the doping concentration of the N type well) is $10^{16}$ ions/cm$^2$ or less. Further, it can be seen from the left doping concentration that the doping concentration indicated by curve B in an example in which the NTOP 120 is formed is higher than the doping concentration indicated by curve A in an example in which the NTOP is not formed. The doping concentration below the P− type buried layer 104 is lower than that of the NTOP 120. This is because the additional doping is performed on the NTOP 120.

Figure 8B:
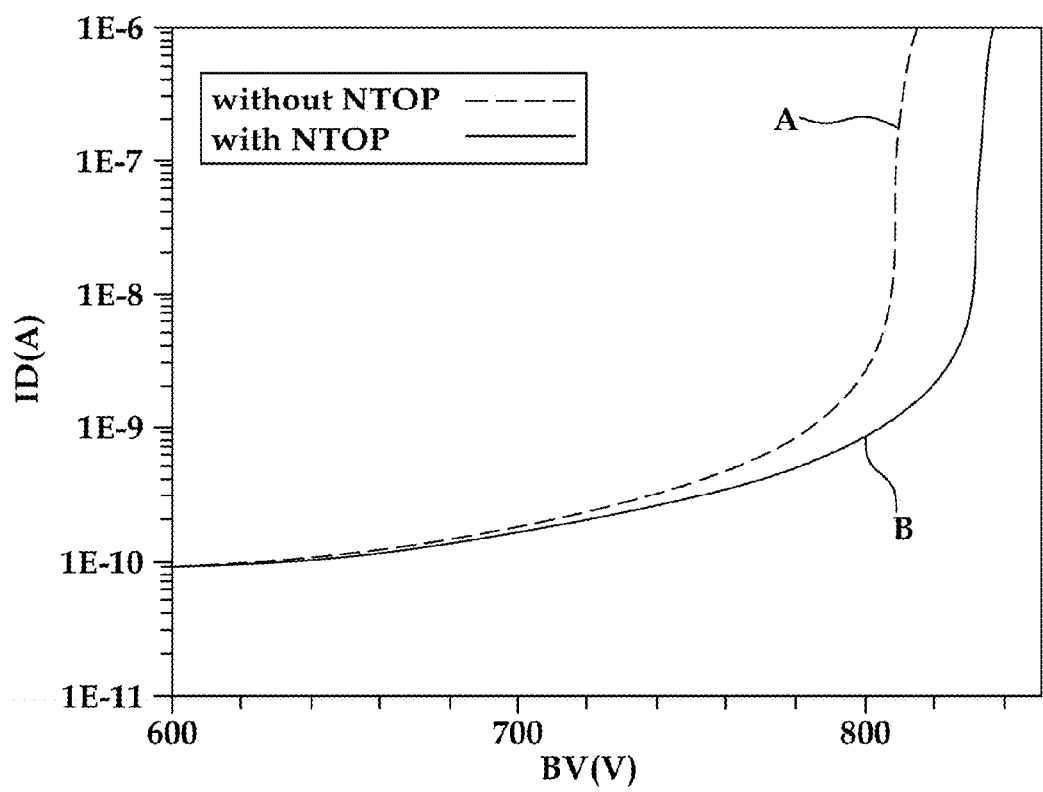
FIG. 8B is a graph illustrating a change in breakdown voltage according to the presence and the absence of an N type top (NTOP) of the power device illustrated in FIG. 6.

FIG. 8B illustrates that the breakdown voltage in an X-axis, and the drain current in the Y-axis. According to FIG. 8B, the breakdown voltage of an example in which the NTOP 120 is present exhibits improvement in comparison to an example without the NTOP 120. In the example illustrated in FIG. 8B, the breakdown voltage is improved by about 20 to 40 V when the NTOP 120 is formed, as compared when the NTOP 120 is not formed.

Figure 8C:
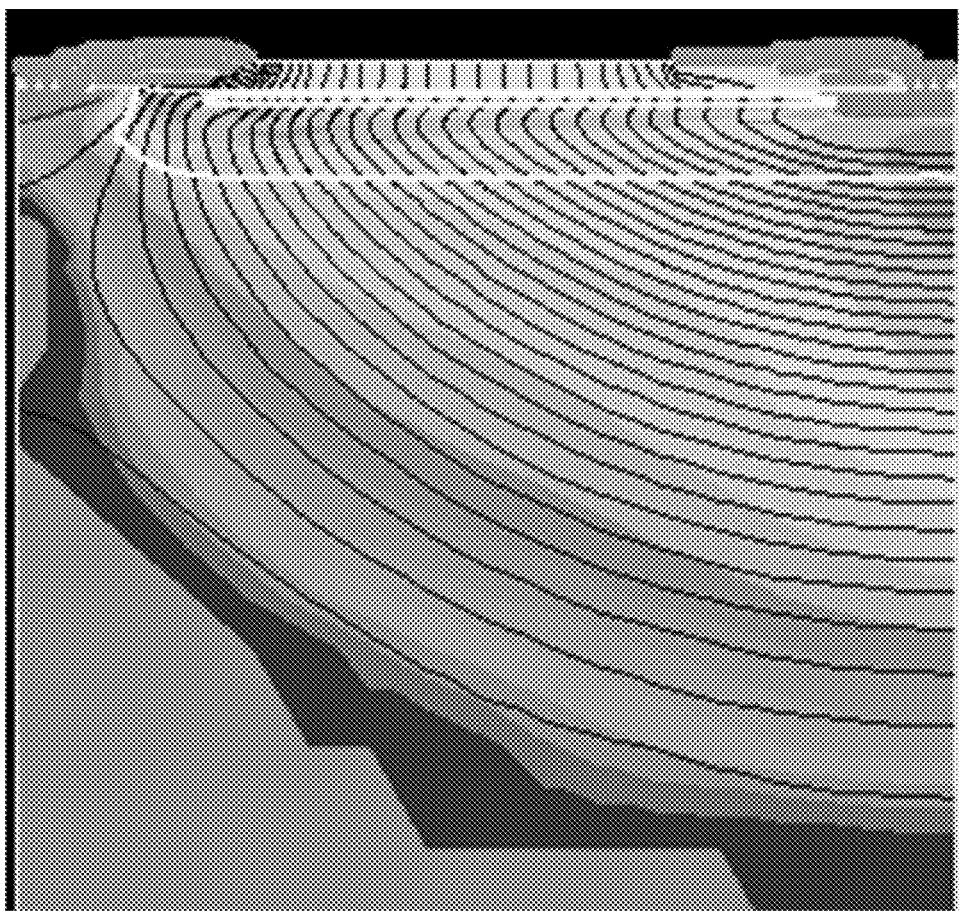
FIG. 8C is a graph illustrating a doping concentration simulation result of an electrical contour while the power device of FIG. 6 is generating a breakdown voltage.

FIG. 8C is a graph illustrating a doping concentration simulation result of an electric contour when a power device having the structure of the example illustrated in FIG. 6 generates a breakdown voltage. It can be seen from the graph illustrated in FIG. 8C that electric contours are uniformly distributed and an optimal breakdown voltage is obtained.

FIG. 8D illustrates a flow state of current flowing to a cross-section A-A' of FIG. 6. A concentration peak in the left of FIG. 8D is the amount of current above P⁻ type buried layer 104, and a concentration peak in the right of FIG. 8D is the amount of current below P⁻ type buried layer 104. The left concentration peak region of FIG. 8D illustrates more current flow in an example in which the NTOP is formed, as indicated by curve B, than in an example in which the NTOP is not formed, as indicated by curve A.

Figure 9:
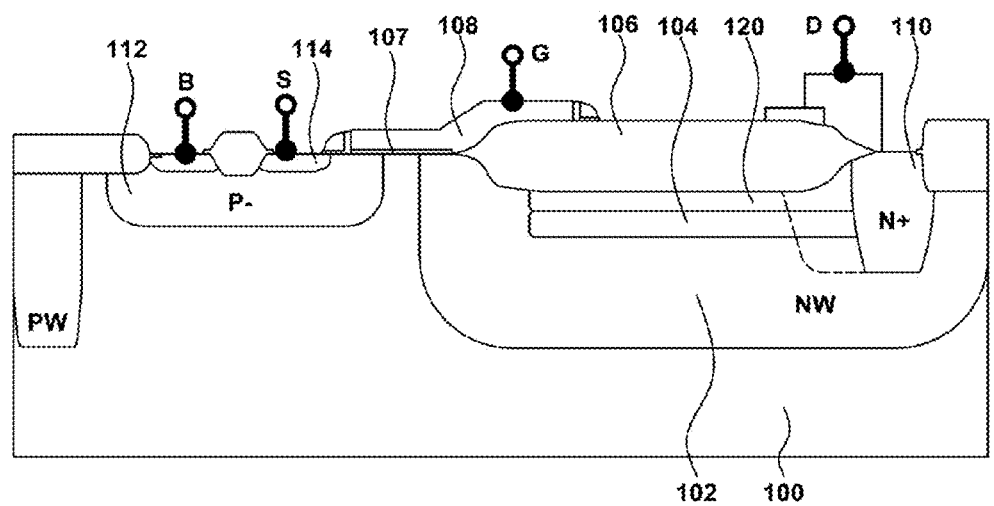
FIG. 9 is a cross-sectional view illustrating a power device according to another example.

FIG. 9 is a cross-sectional view illustrating another example of a power device.

Referring to FIG. 9, an N⁺ type region 110 in a drain terminal extends vertically toward a bottom of an N type well 102. However, as compared with the example illustrated in FIG. 6, it can be seen that the N⁺ type region 110 is formed to be shorter. That is, the N⁺ type region illustrated in FIG. 6 is a region extended to a dotted portion.

A P⁻ type buried layer 104 and an NTOP 120 formed in the N type well 102 extend to a direction toward the N⁺ type region 110 so as to contact the N⁺ type region 110. In this example, the N⁺ type region 110 contacts only one end of the P⁻ type buried layer 104 and one end of the NTOP 120, and the N⁺ type region 110 has a doping depth larger than or equal to that of the P⁻ type buried layer 104. This arrangement improves a current path formed below the P⁻ type buried layer 104, and thus reduces specific on-resistance Rsp of the fabricated transistor.

Figure 10:
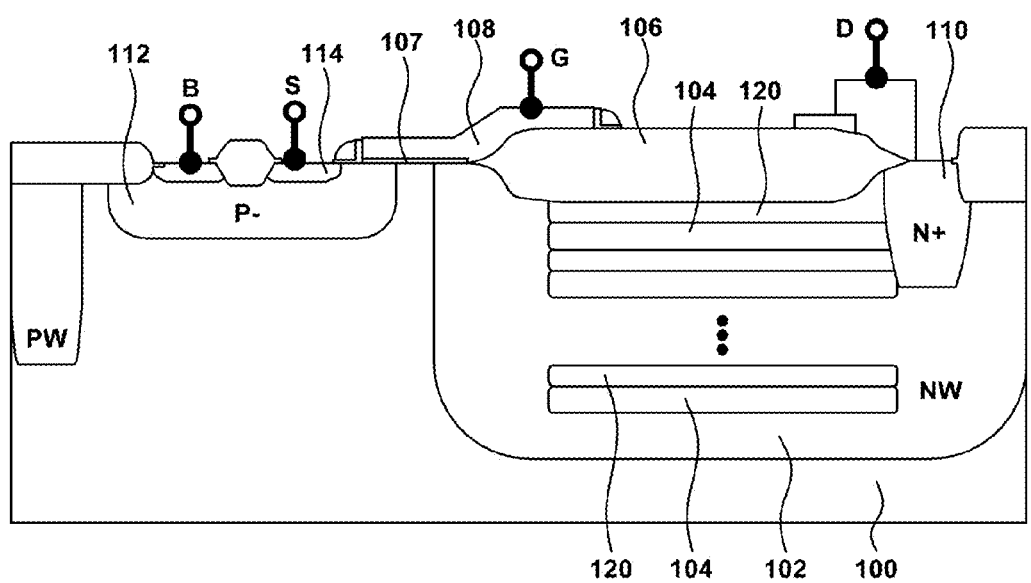
FIGS. 10 and 11 are cross-sectional views illustrating power devices according to additional examples.
Figure 11:
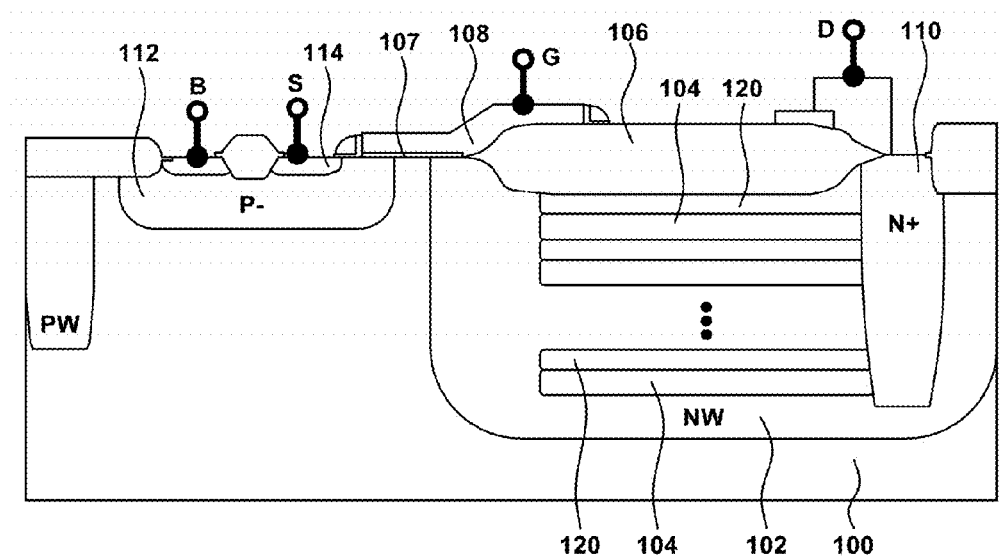

FIGS. 10 and 11 are cross-sectional views illustrating power devices according to additional example. In the example illustrated in FIG. 10, the power device has a structure in which a plurality of P⁻ type buried layers 104 and a plurality of NTOPs 120 are formed to form a plurality of current paths.

First, referring to FIG. 10, the plurality of P⁻ type buried layers 104 are located in the N type well 102 with the NTOPs 120 interposed therebetween, and the plurality of P⁻ type buried layers 104 extend lengthwise toward the N⁺ type region 110. Further, the N⁺ type region 110 is formed to extend toward a bottom of the N type well 102. In this example, the N⁺ type region 110 has a depth that allows the N⁺ type region 110 to contact only a portion of the plurality of P⁻ type buried layers 104 and a portion of the plurality of NTOPs 120. Some of the plurality of P⁻ type buried layers 104 and some of the plurality of NTOPs 120 do not contact the N⁺ type region 110.

On the other hand, in FIG. 11, the N⁺ type region 110 is formed to extend so that the N⁺ type region 110 has a sufficient depth to contact all of the plurality of P- type buried layers 104 and the plurality of NTOPs 120. Because the N⁺ type region 110 has a large depth, the N⁺ type region may be obtained by forming a deep trench and depositing a conductive poly silicon layer. Alternatively, the N⁺ type region 110 may be formed through ion implantation with a deep energy range.

According to the structure, a plurality of current paths may be ensured while resistances of current paths formed above and below P⁻ type buried layer 104 are reduced so that faster switching response may be obtained.

Figure 12:
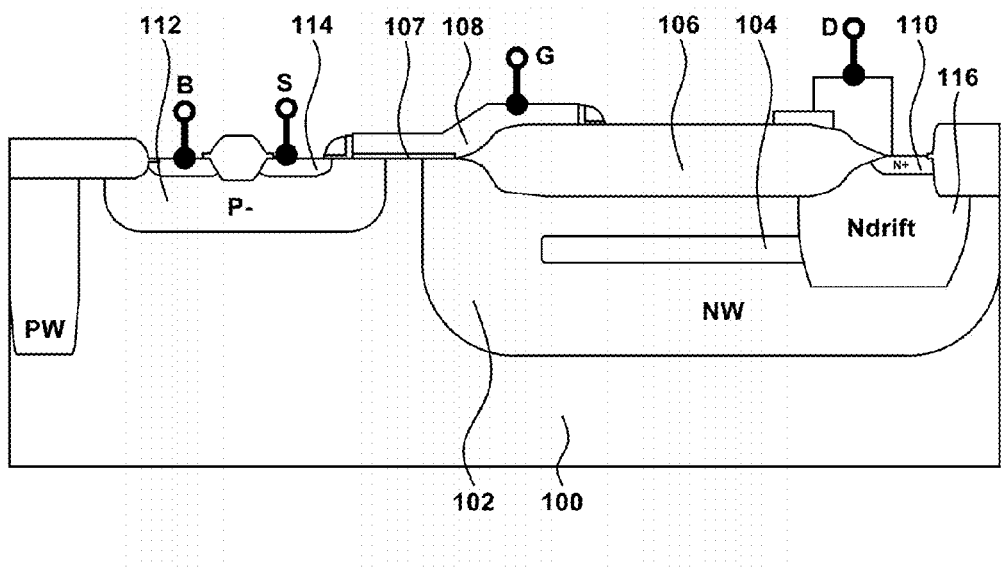
FIG. 12 is a cross-sectional view illustrating a power device according to an additional example.

FIG. 12 is a cross-sectional view of another example of a power device.

In the example illustrated in FIG. 11, the N⁺ type region 110 is expanded. However, in the example illustrated in FIG. 12, the N⁺ type region 110 is not expanded to the same degree. Rather, an N type drift region 116 doped with low concentration ions is formed below the N⁺ type region 110. Other variations include using the N well as described above.

A P⁻ type buried layer 104 is formed in an N type well 102, and one end of the P⁻ type buried layer 104 contacts the N type drift region 116.

In the example illustrated in FIG. 12, an NTOP 120 (not shown) may be formed between the LOCOS oxide layer 106 and the P⁻ type buried layer 104 to form a path for current flow having a resistance lower than that in the N type well 102, and to have a breakdown voltage having a certain level or more.

Figure 13:
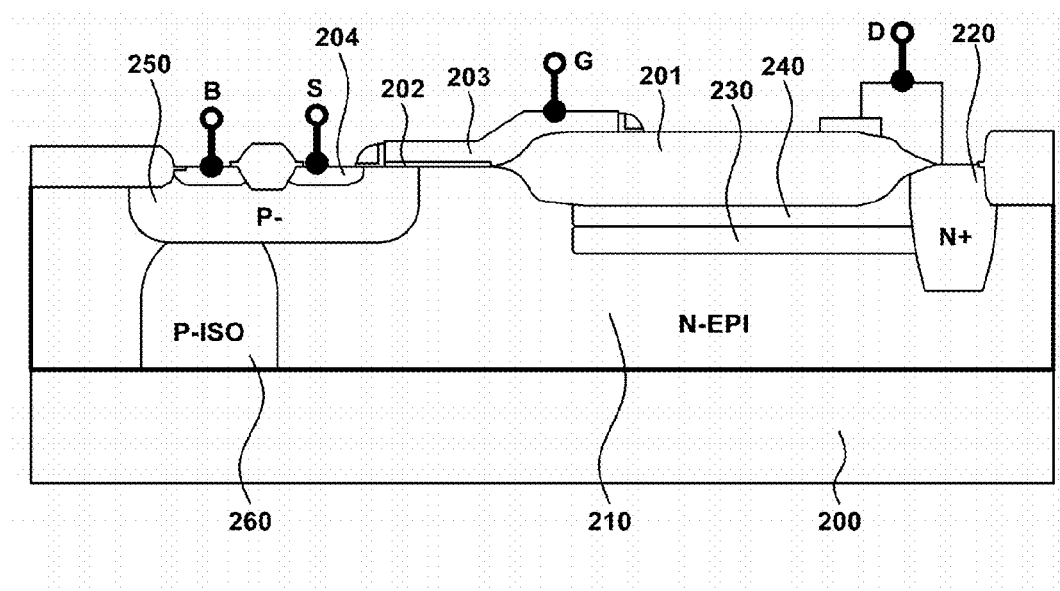
FIG. 13 is a cross-sectional view illustrating a power device according to an additional example.

FIG. 13 is a cross-sectional view illustrating a power device according to yet another example.

The example of the power device illustrated in FIG. 13 uses an epitaxial layer 210 other than a well. Rather, an N⁻ type epitaxial layer 210 is formed on a P type substrate 200, and an N⁺ type region 220 for drain region formation is formed in the N⁻ type epitaxial layer 210. The N⁺ type region 220 has an expanded region that extends into the epitaxial layer 210. A P⁻ type buried layer 230 and an NTOP 240 extend lengthwise so that the P⁻ type buried layer 230 and the NTOP 240 contact the N⁺ type region 220. Without the lengthwise extension of the P⁻ type buried layer 230 and the NTOP 240, the N⁺ type region 220 may extend to contact the P⁻ type buried layer 230 and the NTOP 240.

The N⁻ type epitaxial layer 210 is formed on the P type substrate 200. The N⁻ type epitaxial layer 210 is a region entirely doped with the same conductivity type impurities (that is, N type impurities). Therefore, an isolation, which is a device isolation layer configured to electrically isolate adjacent devices from each other, is necessary. It is because when various kinds of devices are integrated on one substrate in the lateral power device, the adjacent devices are formed in the same conductivity type epitaxial layer. That is, it is because the adjacent devices affect each other when the isolation is not formed.

Therefore, in the example illustrated in FIG. 13, an isolation region 260 is formed between a P type body region 250, in which a source region is to be formed, and the P type substrate 200. The isolation region 260 is doped with P type dopants. The P⁻ type isolation region 260 may be formed through an ion implantation process after the forming of the N⁻ type epitaxial layer 210. Accordingly, the N type LDMOS device as the power device is surrounded by the P⁻ type isolation region 260 to be isolated from adjacent devices. The P⁻ region 260 can be formed by a P⁻ type buried layer formed at an interface of the substrate 200 and the N⁻ type epitaxial layer 210. It can also be formed by very high energy ion implantation of P⁻ type dopants from the top surface, through the P type body region 250. Or, it can also be formed by including deep P type regions that may already be present in the IC process such as the P type well (body region of the low-voltage NMOS transistor included in 5V CMOS transistor for example), or any other deep P region which may be included in the process flow In the above-described power devices illustrated in FIGS. 3, 6 and 9-13, the LOCOS oxide layer is configured to insulate the gate and the drain. However, in other examples, the LOCOS oxide layer may not be present. Examples of power device having no LOCOS oxide layer are described with reference to FIGS. 14 and 15.

Figure 14A:
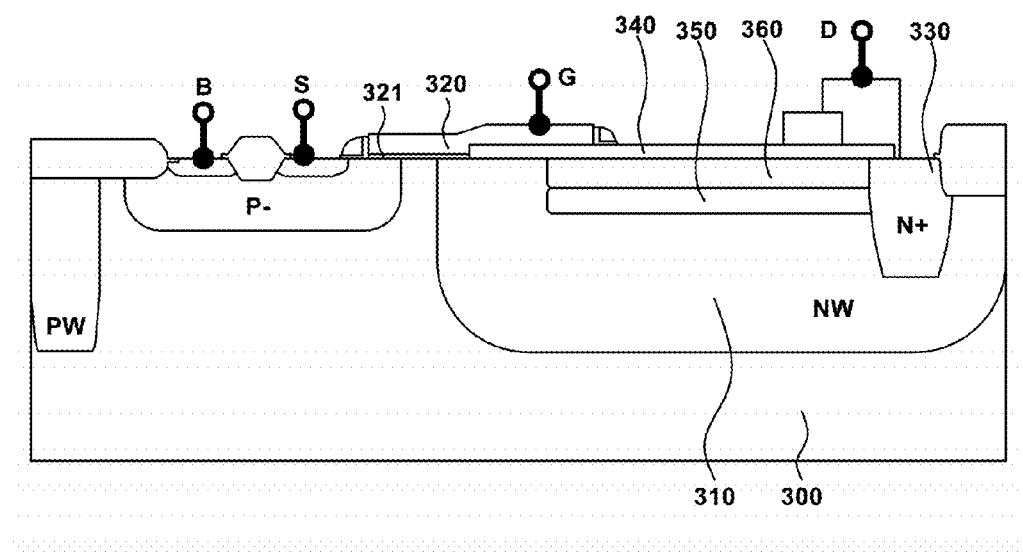

FIGS. 14A and 14B are cross-sectional views illustrating power devices according to another example.

The examples of power device illustrated in FIGS. 14A and 14B have the same structure as the power device described with reference to FIG. 6. However, the power device of FIG. 14A is different from the power device of FIG. 6 in that a plate-like insulating layer is formed in a location in which the LOCOS oxide layer is provided in the power device illustrated in FIG. 6.

Referring to FIG. 14A, an N type well 310 is formed in a P type substrate 300. A gate 320 is formed on the N type well 310, and an $N^+$ type region 330 is formed in the N type well 310. The gate 320 and the $N^+$ type region 330 are separated by an insulating layer 340. The insulating layer 340 is formed on the P type substrate 300. A $P^-$ type buried layer 350 and an NTOP 360 are formed in the N type well 310. One end of the $P^-$ type buried layer 350 and one end of the NTOP region 360 contact the $N^+$ type region 330.

Referring to FIG. 14B, an example in which the plate-like insulating layer 340 is formed through a plurality of fabrication processes is illustrated. That is, when the plate-like insulating layer 340 is formed through several operations, the insulating layer having an irregular thickness may be configured. For example, the insulating layer 340 may be configured to include a central portion 340a having a first thickness and left and right side portions 340b, 340C having a thickness smaller than the first thickness. The left and right side portions are formed to be thicker than the gate oxide layer 321

Accordingly, a current path is shorter as compared with the structure including the LOCOS oxide layer. That is, in the above-described examples illustrated in FIGS. 3, 6 and 9-13, because the LOCOS oxide layer extends into the P type substrate from the surface of the P type substrate by a certain depth, the current cannot help but flow so as to bypass the thickness of the LOCOS oxide layer. On the other hand, when the plate-like insulating layer 340 is formed on the surface of the P type substrate 300 as in the example illustrated in FIGS. 14A and 14B, a current path close to a straight line is formed along a bottom of the insulating layer 340. In such an example, the plate-like insulating layer 340 may have a thickness smaller or larger than thickness of the LOCOS oxide layer or may be equal to that of the LOCOS oxide layer.

FIG. 14A and FIG. 14B illustrate examples in which the $N^+$ type region 330 extends a direction toward the $P^-$ type buried layer 350, but the P– type buried layer 350 and the NTOP 360 may extend toward the $N^+$ type region 330 to contact the $N^+$ type region 330.

The above-described examples illustrated in 3, 6 and 9-13 include the LOCOS oxide layer, the plate-like insulating layer, and a STI layer that are formed independently. However, in other examples, the gate and the drain may be insulated by combining two or more of the LOCOS oxide layer, the plate-like insulating layer, and a STI layer. The goal would be to start with thinner oxide on the drain side of the gate/channel, and to increase total thickness towards the drain in order to reduce the peak electric field. Also, tapering of the oxide at the drain contact edges (perimeter) can also be considered to reduce the peak field at the drain contact edges.

Examples in which two or more of a LOCOS oxide layer, the plate-like insulating layer and a STI layer are combined are described with reference to FIGS. 15A to 15D. FIGS. 15A to 15D are cross-sectional views illustrating additional examples of power devices.

Figure 15A:
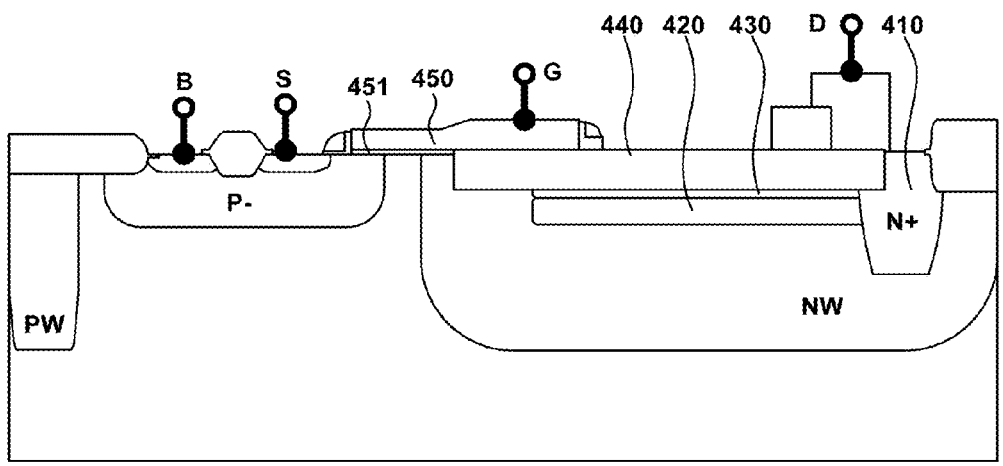
FIGS. 15A to 15D are cross-sectional views illustrating power devices according to additional examples.

First, FIG. 15A illustrates an example in which one STI layer 440 is formed rather than the LOCOS oxide layer formed in the example illustrated in FIG. 1. In the example, an $N^+$ type region 410, and a $P^-$ type buried layer 420 and an NTOP 430 are extended to a direction facing each other so that the $P^-$ type buried layer 420 and the NTOP 430 contact the $N^+$ type region 410.

Figure 15B:
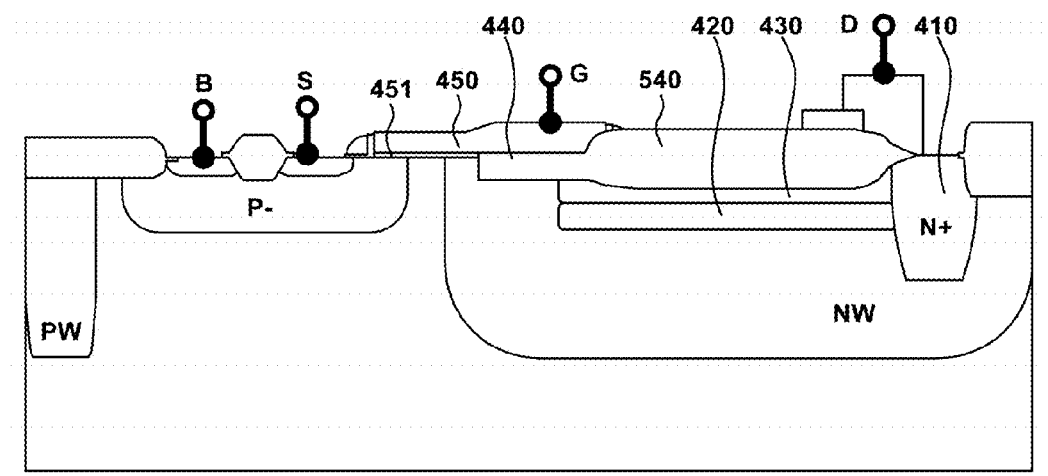
Figure 15C:
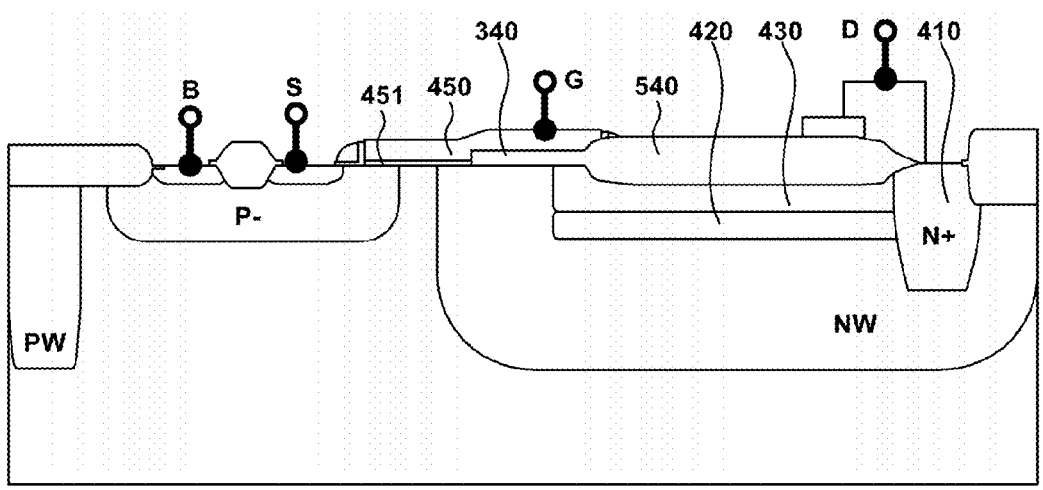
Figure 15D:
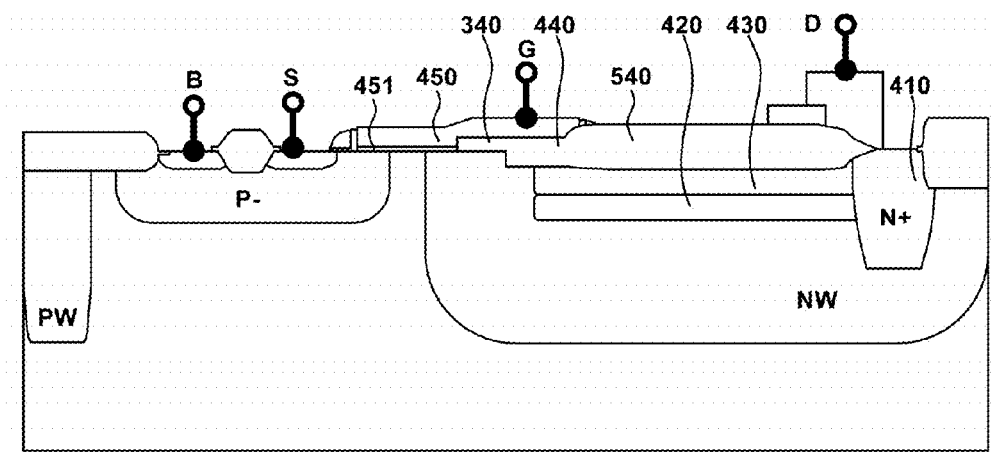

On the other hand, FIGS. 15B to 15D illustrate additional examples in which two or more of a LOCOS oxide layer, a plate-like insulating layer, and an STI layer are combined.

That is, FIG. 15B illustrates an example in which an STI layer 440 and the LOCOS oxide layer 540 are combined. FIG. 15C illustrates an example in which a plate-like insulating layer 340 and a LOCOS oxide layer 540 are combined. Further, FIG. 15D illustrates an example in which the plate-like insulating layer 340, an STI layer 440, and the LOCOS oxide layer 540 are combined. In FIGS. 15B to 15D, the plate-like insulating layer 340, an STI layer 440, and the LOCOS oxide layer 540 have a structure to be arranged in a row between the gate 320 and the $N^+$ type region 330. As in FIG. 15A, the $N^+$ type region 410, and a $P^-$ type buried layer 420 and an NTOP 430 extend toward a direction facing each other so that the $P^-$ type buried layer 420 and the NTOP 430 contact the $N^+$ type region 410.

In the example illustrated in FIG. 15C, the $N^+$ type region 410 in a drain terminal may be formed through a plurality of ion implantation processes. The number of ion implantation processes may be changed according to a dimension of a region to be formed through the ion implantation process.

Therefore, the source region in the above-described examples is formed to a considerable shallow depth from the surface of a substrate through a shallow doping process. The drain region may be formed to a deep depth from the surface of the substrate through repeated ion implantation processes.

The source region and drain region of the power device according to the example illustrated in FIG. 15C is described with reference to a graph in FIG. 16. FIG. 16 illustrates the doping concentrations in the source and the drain of the power device according to the above example.

FIG. 16 demonstrates that a source region I is a high concentration region having a concentration in a range of $10^{18}$ to $10^{21}$ ions/cm$^2$ formed in a shallow depth in a range of 0.5 to 1 micron from the surface of the P type substrate 10.

On the other hand, a drain region II may be divided into two sections. In a first section, like the source region I, a high concentration region having a concentration in a range of $10^{18}$ to $10^{21}$ ions/cm$^2$ is formed in a shallow depth in a range of 0.5 to 1 micron from the surface of the P type substrate 10. In a second section, a low concentration region having a concentration in a range of $10^{14}$ to $10^{18}$ ions/cm$^2$ lower than that of the first section is formed in a depth in a range 1 to 8 microns from the surface of the P type substrate 10. Therefore, the drain region II has the two sections unlike the source region I.

As illustrated in FIG. 8A, since a doping concentration of the NTOP is in a range of $10^{15}$ to $10^{16}$ ions/cm$^2$, and a doping concentration of an N type well is $10^{16}$ ions/cm$^2$ or less, the doping concentration of the first section is higher than those of the NTOP and the N type well. Therefore, low specific on-resistance may be obtained. Further, a breakdown voltage may be increased due to the second section. It is because an electric field of the $N^+$ type drain region may be alleviated by the second section having the concentration lower than that of the first section and a depth larger than that of the first section. Thus, the breakdown voltage is increased. When only the first section having the high concentration exists in the drain region II, a sharp electric field is formed between the first section and the N type well, and thus the breakdown voltage may be reduced.

The drain region II may be formed with a greater depth than the P⁻ type buried layer formed in the N type well so that a doping depth of the drain region II may be larger than that of the P⁻ type buried layer. Alternatively, the drain region II may be formed with the same doping depth as the P⁻ type buried layer.

As described above, the examples of the power device may have a structure in which the drain region and the buried layer are in contact with each other to generate a high breakdown voltage and to maintain high switching characteristic as compared with existing power devices. Therefore, it can be seen that in the power devices, the doping profile of the source region I is considerably different from that of the drain region II. That is, during the LDMOS fabrication process, the N⁺ type drain region are opened by masks several times so that the concentration of the N⁺ type drain region is increased and at the same time, a depth of the N⁺ type drain region is expended. Therefore, the doping profile of the N⁺ type drain region becomes different from that of the N+ type source region. The openings of the masks several times mean that the concentration is increased according to the number of openings and ion implantation with high energy is performed.

Described above are examples of power devices that use a P type substrate. However, in other examples, a power device may use an N type substrate. Each P type regions in such an example may correspond to an N type region illustrated in the above examples, and each N type regions in such an example may correspond to a P type region illustrated in the above examples.

The structure of the semiconductor power device may exhibit the following effects.

One of a buried layer doped with the same dopant type as a semiconductor substrate, and a drain region may be extended in a well of the semiconductor substrate so that the buried layer and the drain region are in contact with each other. That is, the buried layer may extend in a direction toward the drain region, or the drain region may extend into the well.

A high concentration doping layer doped with the same dopant type as the well may be further formed between the buried layer and the semiconductor substrate. In such an example, the buried layer and the doping layer may be in contact with the drain region.

Therefore, the power device may exhibit improved breakdown voltage through the reduction in a resistance component due to the dopants of the well, ensuring fast switching characteristics.

The examples described above have a wide application range. The example may be applied to power devices including a LOCOS oxide layer, a plate-like insulating layer, and an STI structure as well as a power device having an epitaxial layer, and a power device including a well.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor power device, comprising:
    a first well region having a first conductivity type disposed in a substrate having a second conductivity type opposite the first conductivity type;
    a gate overlapping the first well region, and vertically separated from the first well region by an insulating layer;
    a source region disposed at a first side of the gate;
    a buried layer having the second conductivity type disposed laterally in the first well region, wherein the buried layer is vertically separated from the insulating layer by at least a portion of the first well region;
    a drain region having the first conductivity type disposed on a second side of the gate laterally opposite the first side, and contacting the buried layer to form a p-n junction between the drain region and the buried layer;
    a body region having the second conductivity type disposed in the substrate at the first side of the gate;
    a body contact region contacting the body region; and
    a first isolation region disposed between the body contact region and the source region,
    wherein the drain region has a depth greater than the source region and is spaced apart from the substrate by the first well region,
    wherein the source region is disposed in the body region, the body region having a depth shallower than the drain region.

2. The semiconductor power device of claim 1, wherein a depth of the drain region is equal to or larger than a depth of the buried layer, and an end of the buried layer contacts the drain region.

3. The semiconductor power device of claim 2, wherein the drain region has a different doping concentration from that of the source region.

4. The semiconductor power device of claim 1, further comprising an insulating region disposed between the gate and the drain region.

5. The semiconductor power device of claim 4, further comprising a doping layer having an opposite conductivity type to the plurality of buried layers.

6. The semiconductor power device of claim 5, wherein the doping layer is a region having a doping concentration higher than a doping concentration of the first well region.

7. The semiconductor power device of claim 5, wherein the doping layer has a doping concentration lower than a doping concentration of a first section of the drain region.

8. The semiconductor power device of claim 5, wherein one end of the doping layer contacts the drain region.

9. The semiconductor power device of claim 5, wherein the first well and the doping layer are a first conductivity type region, and the buried layer is a second conductivity type region.

10. The semiconductor power device of claim 4, wherein the insulating region includes one selected from the group consisting of a local oxidation of silicon (LOCOS) oxide layer, a plate-like insulating layer, and a shallow trench isolation (STI) layer.

11. The semiconductor power device of claim 4, wherein the insulating region is formed by combining a LOCOS oxide layer and an STI layer.

12. The semiconductor power device of claim 4, wherein the insulating region is a plate-like insulating layer including a LOCOS oxide layer.

13. The semiconductor power device of claim 4, wherein the insulating region is formed by combining a LOCOS oxide layer, a plate-like insulating layer, and an STI layer.

14. The semiconductor power device of claim 1, further comprising:
an epitaxial layer disposed on the substrate; and
a third isolation region disposed in the epitaxial layer.

15. The semiconductor power device of claim 1, wherein the drain region comprises a first portion and a second portion below the first portion, and
wherein the first portion of the drain region has a first dopant concentration profile with respect to depth the same as a dopant concentration profile with respect to depth of the source region.

16. The semiconductor power device of claim 1, wherein the drain region comprises a first portion and a second portion, and
wherein the first portion has a first dopant concentration profile with respect to depth having a slope greater than a slope of a second dopant concentration profile with respect to depth of the second portion of the drain region.

17. The semiconductor power device of claim 1, wherein the drain region comprises a first portion and a second portion below the first portion, and
wherein the second portion has a dopant concentration profile with respect to depth that decreases more gradually relative to a dopant concentration profile with respect to depth of the first portion.

18. A semiconductor power device, comprising:
a first well region having a first conductivity type disposed in a substrate having a second conductivity type opposite the first conductivity type;
a gate overlapping the first well region, and vertically separated from the first well region by an insulating layer;
a source region disposed at a first side of the gate;
a buried layer having the second conductivity type disposed laterally in the first well region, wherein the buried layer is vertically separated from the insulating layer by at least a portion of the first well region;
a drain region having the first conductivity type disposed on a second side of the gate laterally opposite the first side, and contacting the buried layer to form a p-n junction between the drain region and the buried layer;
a body region having the second conductivity type disposed in the substrate at the first side of the gate;
a body contact region contacting the body region;
a first isolation region disposed between the body contact region and the source region;
a second isolation region disposed adjacent to the body region; and
a second well region having the second conductivity type disposed below the second isolation region,
wherein the drain region has a depth greater than the source region and is spaced apart from the substrate by the first well region.

19. The semiconductor power device of claim 18, wherein the second well region has a depth deeper than that of the body region.

* * * * *